United States Patent
Fukuyama et al.

(10) Patent No.: US 7,249,295 B2
(45) Date of Patent: Jul. 24, 2007

(54) TEST CIRCUIT FOR SEMICONDUCTOR DEVICE

(75) Inventors: Hiroyuki Fukuyama, Yamanachi (JP); Takeru Yonaga, Tokyo (JP); Hitoshi Tanaka, Kanagawa (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 438 days.

(21) Appl. No.: 10/400,452

(22) Filed: Mar. 28, 2003

(65) Prior Publication Data

US 2004/0097093 A1  May 20, 2004

(30) Foreign Application Priority Data

Sep. 2, 2002  (JP) ............................. 2002-256380

(51) Int. Cl.
    G11C 29/00 (2006.01)
    G11C 7/00 (2006.01)
(52) U.S. Cl. .................... 714/718; 365/201
(58) Field of Classification Search ............... 714/719; 365/201
    See application file for complete search history.

(56) References Cited

U.S. PATENT DOCUMENTS 6,081,916 A * 6/2000 Whetsel, Jr. ............... 714/727
6,499,124 B1 * 12/2002 Jacobson ................... 714/727
6,587,979 B1 * 7/2003 Kraus et al. ............... 714/720
6,704,895 B1 * 3/2004 Swoboda et al. .......... 714/726
6,754,863 B1 * 6/2004 Grannis, III .............. 714/729
6,763,485 B2 * 7/2004 Whetsel .................... 714/726

FOREIGN PATENT DOCUMENTS

JP      10-199294      7/1998

* cited by examiner

Primary Examiner—Cynthia Britt
(74) Attorney, Agent, or Firm—Rabin & Berdo PC

(57) ABSTRACT

A semiconductor test circuit including an input terminal, a controller, a setting circuit, a command generator, a transmission path switching circuit and a comparator. The input terminal receives serial data including a command code and control data. The controller receives a control signal from the input terminal and outputs an internal control signal. The setting circuit receives serial data from the input terminal and outputs it to the command generator in response to the internal control signal. The command generator then generates an interface signal based on this serial data. The switching circuit receives the signal from one of its ports and outputs the received signal to another port in response to the internal control signal and the command code, and the comparator compares the interface signal received from the command generator with the signal received from the switching circuit.

8 Claims, 7 Drawing Sheets ated Japanese Patent Publication No. 1998-199294. As a method of testing the BIST circuit itself, the following two methods are generally known.

TEST CIRCUIT FOR SEMICONDUCTOR DEVICE

BACKGROUND OF THE INVENTION

The present invention relates to a semiconductor test circuit such as a built-in self test (hereinafter called "BIST") circuit or the like used to test the operation of a circuit: such as a semiconductor memory device, and particularly to a semiconductor test circuit having a self monitor mode for performing a self test and a direct access mode for directly testing a circuit.

A BIST circuit built in a large scale integration (hereinafter called "LST") has heretofore been used for testing the operation of a semiconductor memory device or the like as has been described in, for example, Japanese Patent Publication Laid-Open No. 1998-199294. As a method of testing the BIST circuit itself, the following two methods are generally known.

According to the first method, a scan circuit is inserted into a BIST circuit to detect a circuit failure.

According to the second method, signals of a BIST circuit are fetched into external terminals (external pins) of LSI and (detected) by a tester, whereby a circuit failure is detected.

However, the conventional first and second methods respectively involve the following problems.

As to the first method, an actual functional operation of the BIST circuit per se cannot be tested because the BIST circuit is examined through the scan circuit. Therefore, a failure in the actual functional operation of the BIST circuit and a timing failure in the BIST circuit cannot be examined.

As to the second method, there is a need to fetch a plurality of signals of the BIST circuit to LSI external pins through a plurality of wirings respectively. Therefore, a wiring delays for signal transmission exists between the BIST circuit and each LSI external pin. Therefore, timing design at LSI levels of the plurality of signals is needed to assure a high-speed operation for testing, and hence a burden on a designer increases. The present method is accompanied by a problem that LSI external pins corresponding to the number of pins included in the BIST circuit are required, and a small pin package falls short of the number of such pins.

SUMMARY OF THE INVENTION

A semiconductor test circuit according to the present invention includes an input terminal, a controller, a setting circuit, a command generator, a transmission path switching circuit and a comparator. The input terminal receives a serial data including a command code and a control data. The controller receives a control signal and outputs an internal control signal based on the control signal. The setting circuit receives the serial data and outputs it in response to the internal control signal. The command generator generates an interface signal based on the serial data received from the setting circuit. The switching circuit has ports, receives the signal from one of the ports and outputs the received signal to another one of the ports in response to the internal control signal and the command code. The comparator compares the interface signal received from the command generator with the signal received from the switching circuit.

BRIEF DESCRIPTION OF THE DRAWINGS

While the specification concludes with claims particularly pointing out and distinctly claiming the subject matter which is regarded as the invention, it is believed that the invention, the objects and features of the invention and further objects, features and advantages thereof will be better understood from the following description taken in connection with the accompanying drawings in which:

DETAILED DESCRIPTION OF THE PREFERRED EMBODIMENTS

Preferred embodiments of the present invention will hereinafter be described in detail with reference to the accompanying drawings.

Figure 1:
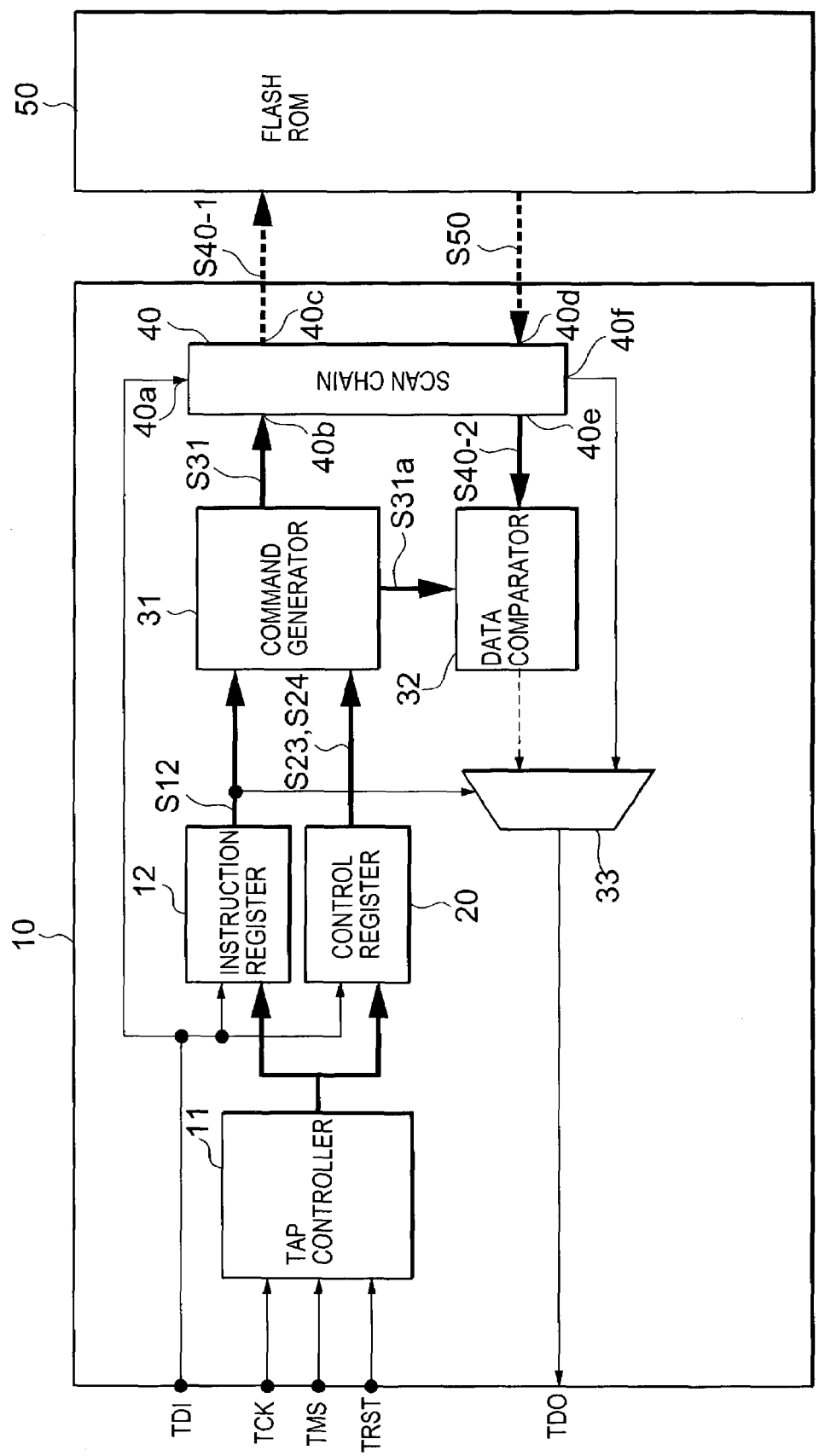
FIG. 1 is a block diagram of a BIST circuit showing an embodiment of the present invention.

FIG. 1 is a schematic configurational diagram of a semiconductor test circuit (e.g., a BIST circuit) showing an embodiment of the present invention.

The BIST circuit 10 is a circuit formed on a semiconductor substrate, for testing a flash memory (hereinafter "flash ROM"), 30 corresponding to an electrically reprogrammable non-volatile memory corresponding to one semiconductor device, for example.

The semiconductor substrate is provided with five test terminals TCK, TDI, TMS, TRST and TDO for a standard serial interface based on a JTAG (IEEE 11.49.1) Standard, for example. The BIST circuit 10 is controlled by the five terminals. Of the five terminals, TCK indicates a clock input terminal for a control terminal, which is used for inputting a test clock tck, and TDT indicates a serial data input terminal for inputting testing serial data tdi, respectively. TMS indicates a serial input/output control terminal for a control terminal, which is used for inputting a serial input/output control terminal tms corresponding to a test mode set signal, TRST indicates a reset terminal for a control terminal, which is used for inputting a testing reset signal trst, and TDO indicates a serial data outputting serial test data, tdo, respectively.

Control means (e.g., a Test Access Port (TAP) controller 11) is connected to the terminals TCK, TMS and TRSI. Setting means [e.g., an instruction register (IR) 12 and a control register (DR) 20] are connected to the output side thereof. The TAP controller 11 is provided with a state machine for generating, for example, states corresponding to sixteen states to control the input/output of the serial data. The state machine has the function of inputting the clock tck, serial input/output control signal tms and reset signal trst from the terminals TCK, TMS and TRST, and outputting internal control signals (such as a clock signal clock-IR, a shift signal shift-LR, an update signal update-IR, a reset signal reset, and a test clock tck) supplied to the instruction register (IR) 12, internal control signals (such as a clock signal clock-DR, a shift signal shift-DR, an update signal update-DR, a reset signal reset and a test clock tck) supplied to the control register 20, etc.

The instruction register 12 is a register for retaining (setting) an instruction code (command code) inputted from the terminal TDI, based on its corresponding internal control signal supplied from the TAP controller 11. Command generating means (e.g., a command generator 31) a selector 33 are connected to the output of the instruction register 12. The control register 20 is a registry for holding (setting) command-generating control data S23 and S24 inputted from the terminal TDI, based on the internal control signals supplied from the TAP controller 11. A command generator 31 is connected to the output of the register.

The command generator 31 is a circuit for generating a flash ROM interface signal S31 [e.g., an address a, a chip select signal cen (where n means the inversion), an output enable signal oen, a write enable signal wen, data d, a write/read enable signal wre, etc.]. Transmission path switch means (e.g., a scan chain 40) and comparing means (e.g., a data comparator 32) are connected to the output of the command generator 31.

The scan chain 40 is used to output the flash ROM interface signal S31 as serial data and comprises a plurality of boundary scan registers (BSRs) connected in serial. These BSRs are controlled by their corresponding internal control signals clock-DR, shift-DR, update-DR and IR command (i.e., instruction code S12).

The scan chain 40 as provided with a first port 40a for inputting the serial data supplied from the input terminal TDI, a second port 40b for inputting the flash ROM interface signal S31 supplied from the command generator 31, a third port 40c for outputting input data S40-1 sent from the first port 40a or the second port 40b to a flash ROM 50, a fourth port 40d for inputting a test result S50 supplied from the flash ROM 50, a fifth port 40e for outputting input data S40-2 sent from the first port 40a, the second port 40b or the fourth port 40d, and a sixth port 40f for outputting the input data sent from the first port 40a, the second port 40b or the fourth port 40d. The scan chain 40 performs switching to data transmission paths among the first, second, third, fourth, fifth and sixth ports 40a through 40f, based on the internal control signals clock-DR, shift-DR, update-DR and IR instruction (instruction code S12).

The data comparator 32 is a circuit for performing a coincidence/non-coincidence comparison between read data S50 of the flash ROM 50 and an expected value S31a for write data supplied from the command generator 31. The selector 33 is connected to the output of the data comparator 32. The selector 33 is a circuit for performing switching between an output produced from the data comparator 32 and an output produced from the scan chain 40, based on the instruction code S12 set to the instruction register 12. The output of the selector 33 is connected to the terminal TDO.

Figure 2:
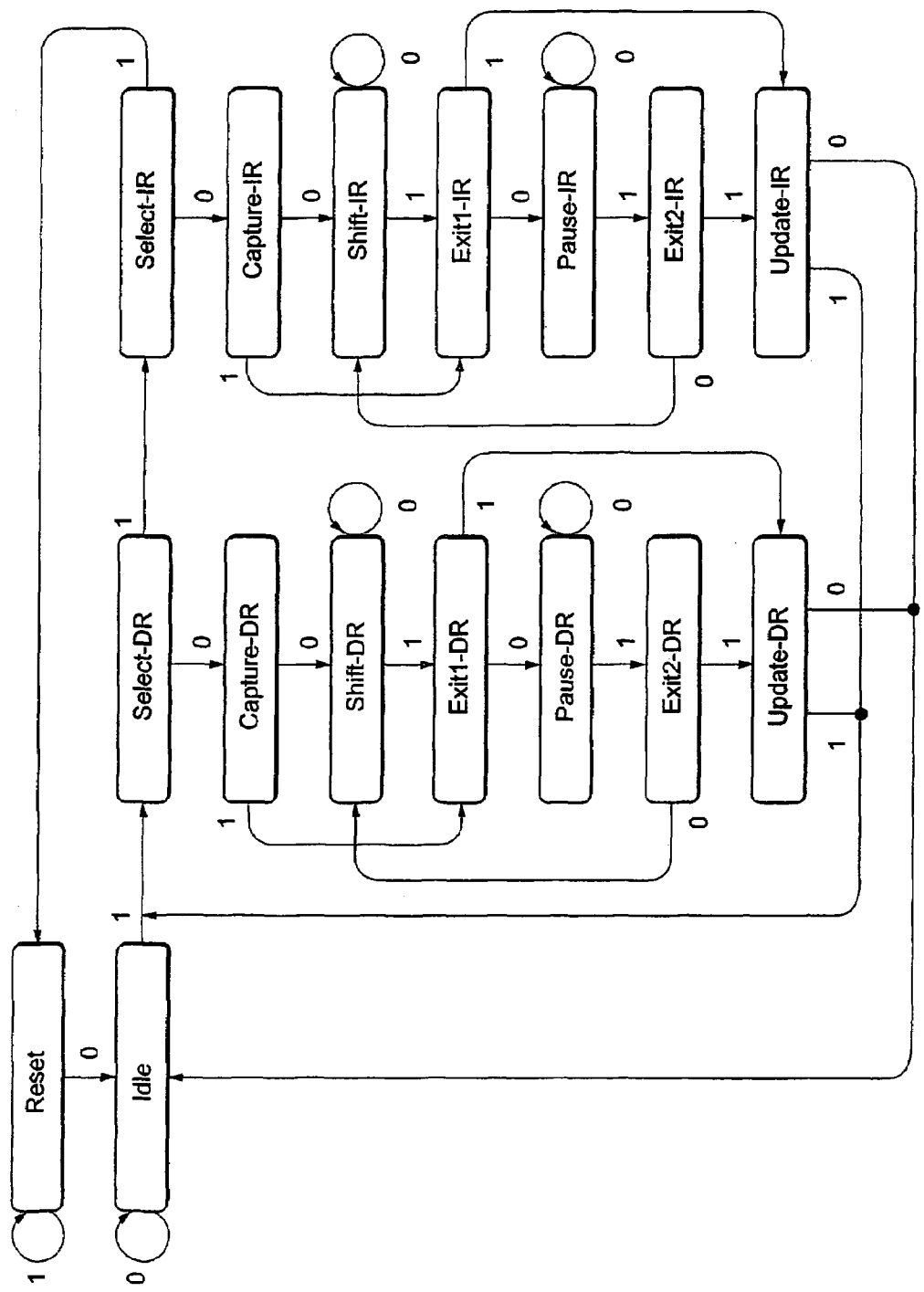
FIG. 2 is a state transition diagram of a TAP controller shown in FIG. 1.

FIG. 2 is a state transition diagram of the TAP controller 11.

The TAP controller 11 changes or transitions states into sixteen according to logic "1" and "0" of the serial input/output control signal tms supplied from the terminal TMS, for example and outputs control signals corresponding to the respective states.

Figure 3:
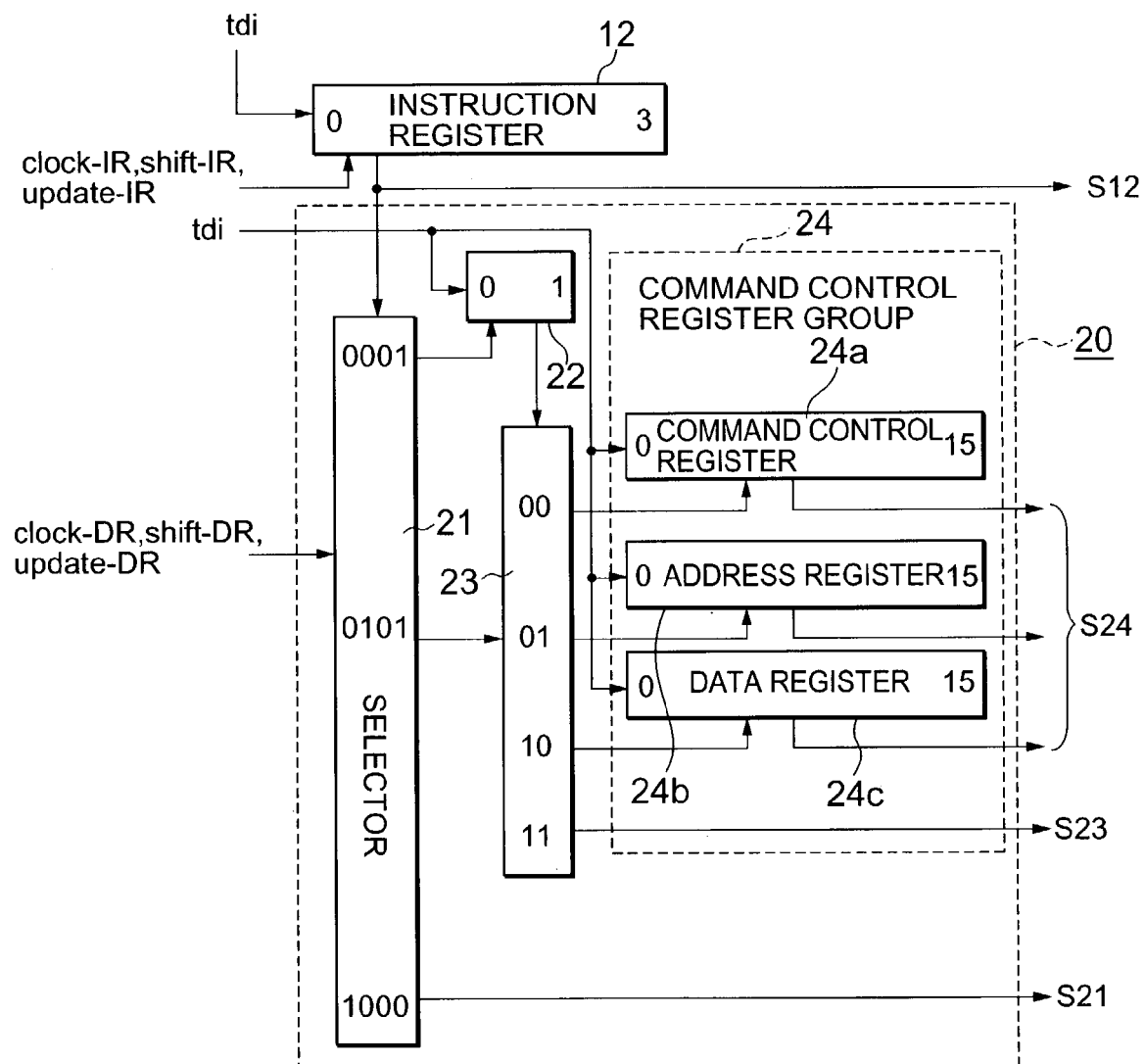
FIG. 3 is a block diagram showing an instruction register and a control register as shown in FIG. 1.

FIG. 3 is a schematic block diagram showing configurational examples of the instruction register 12 and control register 20 shown in FIG. 1.

The instruction register is made up of a 4-bit register, for example.

The control register 20 is a register controlled by the internal control signals (clock-DR, shift-DR and update-DR) supplied from the TAP controller 11 and comprises selectors 21 and 23, a 2-bit select register 22 and a command control register group 24 or the like. The register group 24 has a 16-bit command control register 24a, a 16-bit address register 24b and a 16-bit data register 24c.

In the control register 20, access to the select register 22 is enable when 0001 is set to the instruction register 12. Access to the control register 20 is controlled by the code set thereto. When 1010 is set to the instruction register 12, access to the control register 20 is enabled. When 00 is set to the select register 22 at this time, access to the command control register 24a to which generated commands, an address scan method, etc. are set, is enabled. Similarly, when 01 is set to the select register 22, access to the address register 24b to which an address range is set, is enabled. When 10 is set to the select register 22, access to the data register 24c to which write data is set, is enabled. Control data S24 is outputted from these registers 24a through 24c and supplied to the command generator 31.

When 11 is set to the select register 22, the control register 20 is brought to a command start enable state and transitions a test state in this condition. When the control register 20 is brought to an Update-DR state, for example, a command is start up according to control data S23. When 1000 is set to the instruction register 12, access to the scan chain 40 is enabled by control data S21, whereby a functional operation test of the BIST circuit 10 per se can be performed.

Figure 4A:
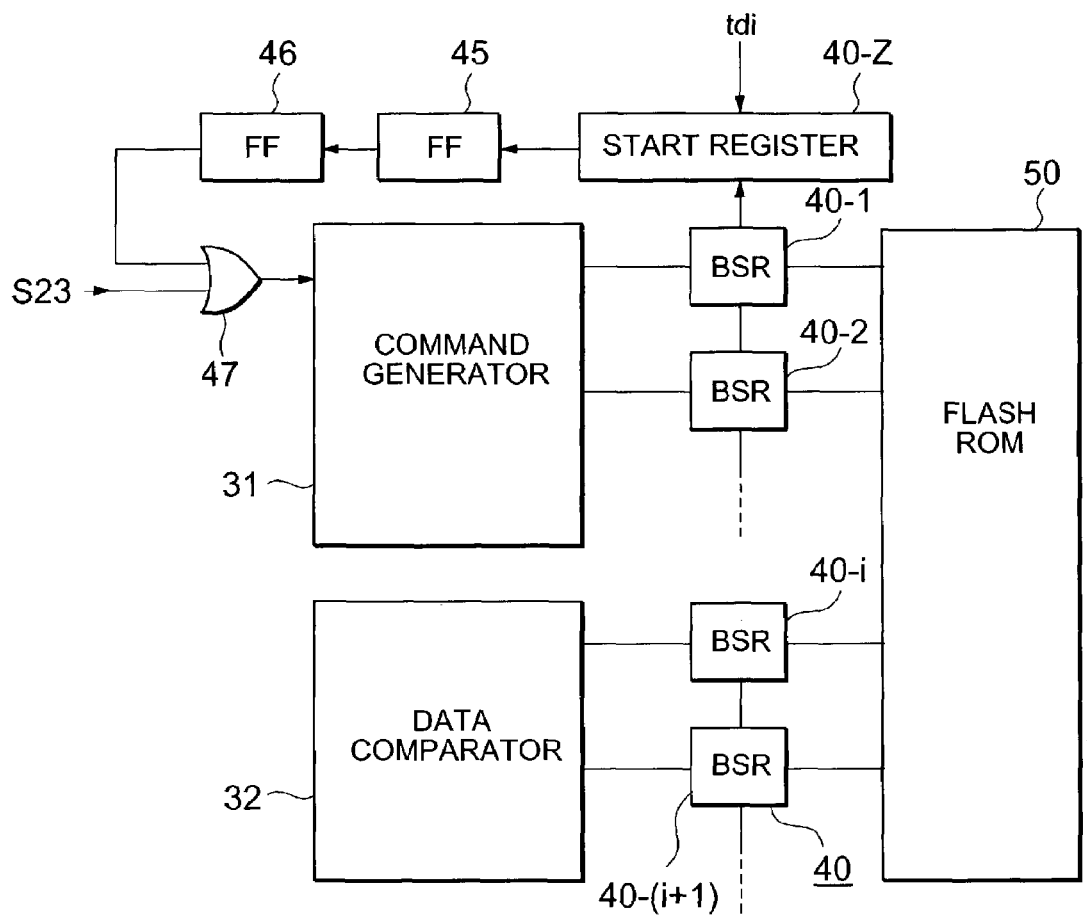
FIGS. 4(A) and 4(B) are respectively block diagrams illustrating a scan chain shown in FIG. 1.
Figure 4B:
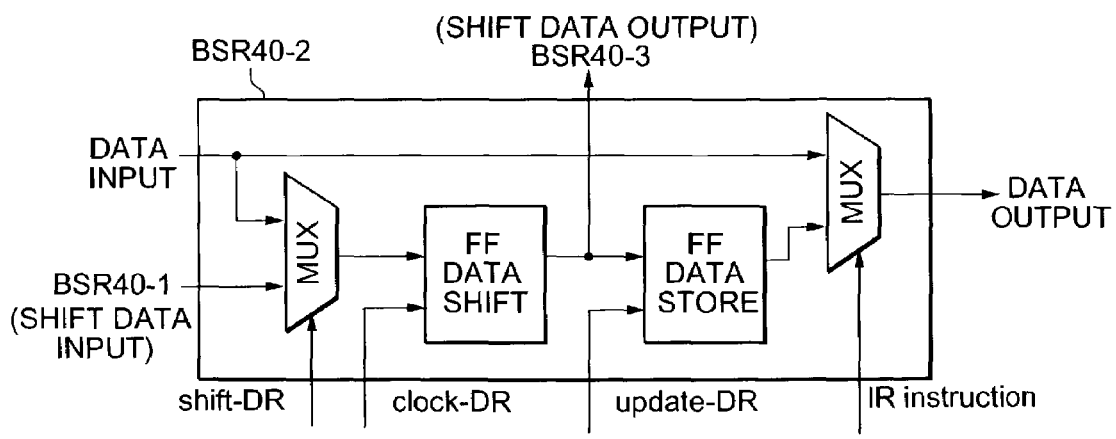

FIGS. 4(A) and 4(B) are respectively schematic configurational diagrams of the scan chain 40 shown in FIG. 1, wherein FIG. 4(A) is an overall configurational diagram of the scan chain 40, and FIG. 4(B) is a circuit diagram showing an example of a configuration of a BSR 40-2, respectively.

As shown in FIG. 4(A), the scan chain 40 comprises a plurality of BSRs 40-1, 40-2, . . . , 40-i, 40-(i+1), . . . , connected in serial. The respective BSRs 40-1, 40-2, . . . , are respectively identical in circuit configuration. The input of a BIST start register 40-z for starting a BIST is connected to a position closest to the input of the scan chain 40, and the output of the register 40-z is connected to the command generator 31 through flip-flops (hereinafter called "FFs") 45 and 46 and a two-input one-output OR gate 47.

For instance, the BSR 40-2 is a register controlled by the internal control signals (e.g., the clock signal clock-DR, shift signal shift-DR and update signal update-DR) supplied from the TAP controller 11, and the IR instruction corresponding to the instruction code S12 set by the instruction register 12.

The BSR 40-2 comprises a multiplexer (hereinafter called "MUX") 41 for inputting data sent from the terminal TDI or the flash ROM 50 and shift data sent from the pre-stage BSR 40-1 and selecting either one thereof, an FF 42 connected to the output of the multiplexer 41 to shift data and for outputting the shift data to the BSR 40-3 of the following stage, an FF 43 for holding the shift data outputted from the FF-42, and an MUX 44 for selecting either one of the data inputted from the terminal TDT or the flash ROM 50 and data outputted from the FF 43 and outputting the same to the flash ROM 50, data comparator 32 or selector 33.

The MUX 41 selects the data sent from the command generator 31 and the like and outputs it to the FF 42 when the shift signal shift-DR is "0". When the shift signal Shift-DR is "1", the MUX 41 reflects the shift data inputted from the pre-stage BSR 40-1 and outputs it to the FF 42. The FF 42 shifts the output data of the MUX 41, based on the clock clock-DR and outputs the shift data to the BSR 40-3 of the following stage and the FF 43. The FF 43 retains the shift data outputted from the FF 42, based on the update signal update-DR. When the IR instruction is "0", the MUX 44 selects the data inputted from the command generator 31 and the like and outputs it to the flash ROM 50 or the like.

When the IR instruction is "1", the MUX 44 selects the output data of the FF43 and outputs it to the flash ROM 50 or the like.

Thus, the BSR 40-2 sequentially sends the shift data inputted from the pre-stage BSR 40-1 to the next-stage BSR 40-3, based on the internal control signals clock-DR, shift-DR update-DR and ITP instruction, for example, to thereby make it possible to perform a test for checking whether data is properly transferred through a boundary scan path, or the normal operation of transmitting the data outputted from the command generator 31 or the like to the flash ROM 50.

Figure 5:
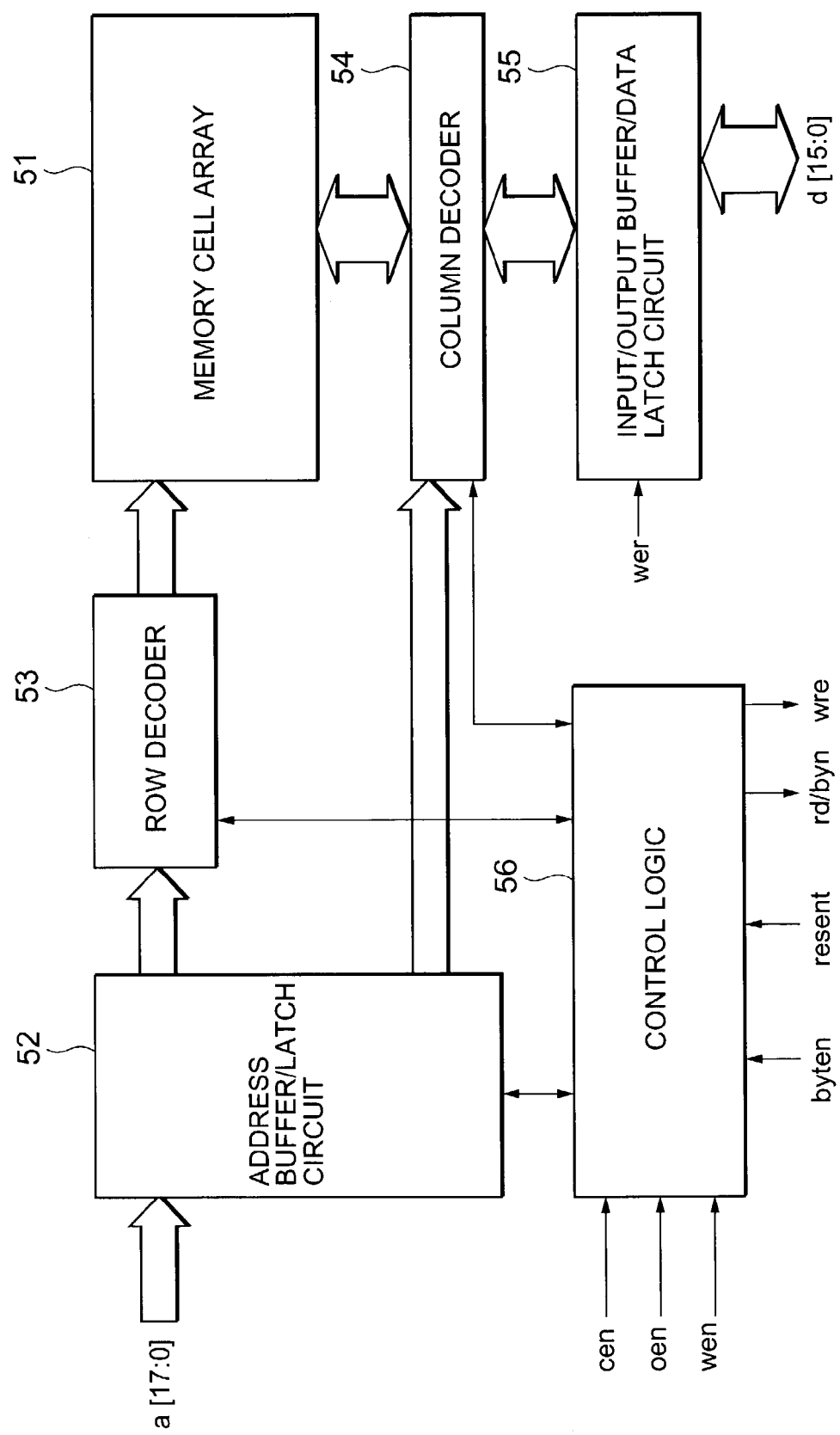
FIG. 5 is a block diagram of a flash ROM as shown in FIG. 1.

FIG. 5 is a schematic configurational diagram showing an example of one configuration of the flash ROM 50 shown in FIG. 1.

The flash ROM 50 has the advantage of being capable of performing batch erasure and small sector erasure and facilitating rewriting and has a memory cell array 51 expressed in 256K words×8 bits, 128K words×16 bits, or the like, for example. Addresses a17 through a0 (i.e., a[17:0]) for selecting the memory cell array 51 are latched in an address buffer/latch circuit 52. A row decoder 53 decodes each latched X address to select its corresponding word line of the memory cell array 51. A column decoder 54 decodes each Y address latched in the address buffer/latch circuit 52 to select its corresponding bit line of the memory cell array 51.

Write data d15 through d0 (i.e., d[15:0]) are latched in an input/output buffer/data latch circuit 55. They are transmitted to their corresponding bit lines selected by the column decoder 54 and written into their corresponding memory cells located at points where the bit lines and the word lines selected by the row decoder 53 intersect respectively. The data written in the memory cells are read through the bit lines and latched into the input/output buffer/data latch circuit 55, which in turn outputs the latched read data d[15:0] therefrom.

A control logic 56 for controlling writing and reading receives therein commands (e.g., a chip select signal ceb, an output enable signal oeb, a write enable signal web), a byte signal byteb, and a reset signal resetb to thereby control the whole flash ROM 50. The control logic 56 brings a ready/busy signal rd/byb to a ready state "1" while a write process is being performed.

(Operational Example of Normal Flash ROM)

Referring to FIG. 3, 0001 is first set to the instruction register 12 and 00 corresponding to a code for selecting the command control register 24a is set to the select register 22. Thereafter, 1010 is set to the instruction register 12 and control data is set to the command control register 24a.

Further, 0001 is set to the instruction register 12 again and 11 corresponding to a code for enabling a command start is set to the select register 22. Afterwards, 1010 is set to the instruction register 12 and thereafter a state is transitioned. When the state is brought to an Update-DR state, the BIST is started according to data (e.g., generated commands, an address scan direction, test data, etc.) S24 set to the command control register 24a.

In the flash ROM 50, a test pattern for writing data of one word (e.g., 8 bits or 16 bits), for example, is inputted to its input terminal during a pattern input period for a write instruction. The input test pattern is latched into the input/output buffer/data latch circuit 55 and written into the memory cell array 51 during a non-volatile program period subsequent to the elapse of the pattern input period. When the writing for one word is completed, a test pattern for writing the following one word is inputted. Test pattern writing is effected on all bits of the memory cell array 51 subsequently in a manner similar to the above and thereafter the written ones are read and checked or detected by a tester.

(Example of the Operation of Performing Functional Operation Test of FIST Circuit per se)

(A) Contents of Operation (1) and (2)

(1) A flash ROM interface signal S31 generated by the BIST circuit 10 is first outputted up to an LSI external pin to thereby confirm validity.

A flash ROM interface signal S31 (command, address and data) for testing the flash ROM 50 is generated by the command generator 31 according to data (e.g., a generated command, an address scan direction, test data, etc.) set to the control register 20.

Operations of the instruction register 12 and control register 20 shown in FIG. 3 and the scan chain 40 and the like shown in FIG. 4 will now be explained.

When the BIST circuit is operated as a BIST circuit monitor mode, control data S24 is set to each of the command control register 24a, address register 24b and data register 24c by a method similar to one used upon the normal flash ROM test. Thereafter, 1000 is set to the instruction register 12. Consequently, the BIST is started up. Since, however, the BIST is started up in a state in which a scan register is being enabled, the present method is different from one used upon the normal flash ROM test and the scan chain 40 is used. The BIST start register 40-z for starting the BIST is provided at a position closest to the input of the scan chain 40. Data "1" of one bit is shift inputted to the register 40-z through the first port 40a. In an Update-DR state, "1" is transmitted to the FF 45. Then it is transmitted to the FF 46 in the following clock cycle. Further, it is transmitted to the command generator 31 as a BIST start signal through the OR gate 47 in another clock cycle. Consequently, the BIST is started in the BIST circuit monitor mode.

Namely, an instruction code 1010 (flash ROM test mode) has been set to the instruction register 12 upon the normal flash ROM test. The flash ROM interface signal S31 is inputted to the flash ROM 50 as a signal (S40-1) having passed through the scan chain 40. When the BIST circuit is operated as the BIST circuit monitor mode, an instruction code 1000 (BIST circuit monitor mode) is set to the instruction register 12. In such a case, the flash ROM interface signal S31 is taken or fetched in BSR 40-1, ... in the scan chain 40. When the instruction code 1000 (BIST circuit monitor mode) is set to the instruction register 12, the selector 33 is switched according to an instruction code S12 of the instruction register 12 so as to output data sent from the scan chain 40 to the terminal TDO, and the signal captured by the scan chain 40 is outputted to the terminal TDO as serial data.

Figure 6:
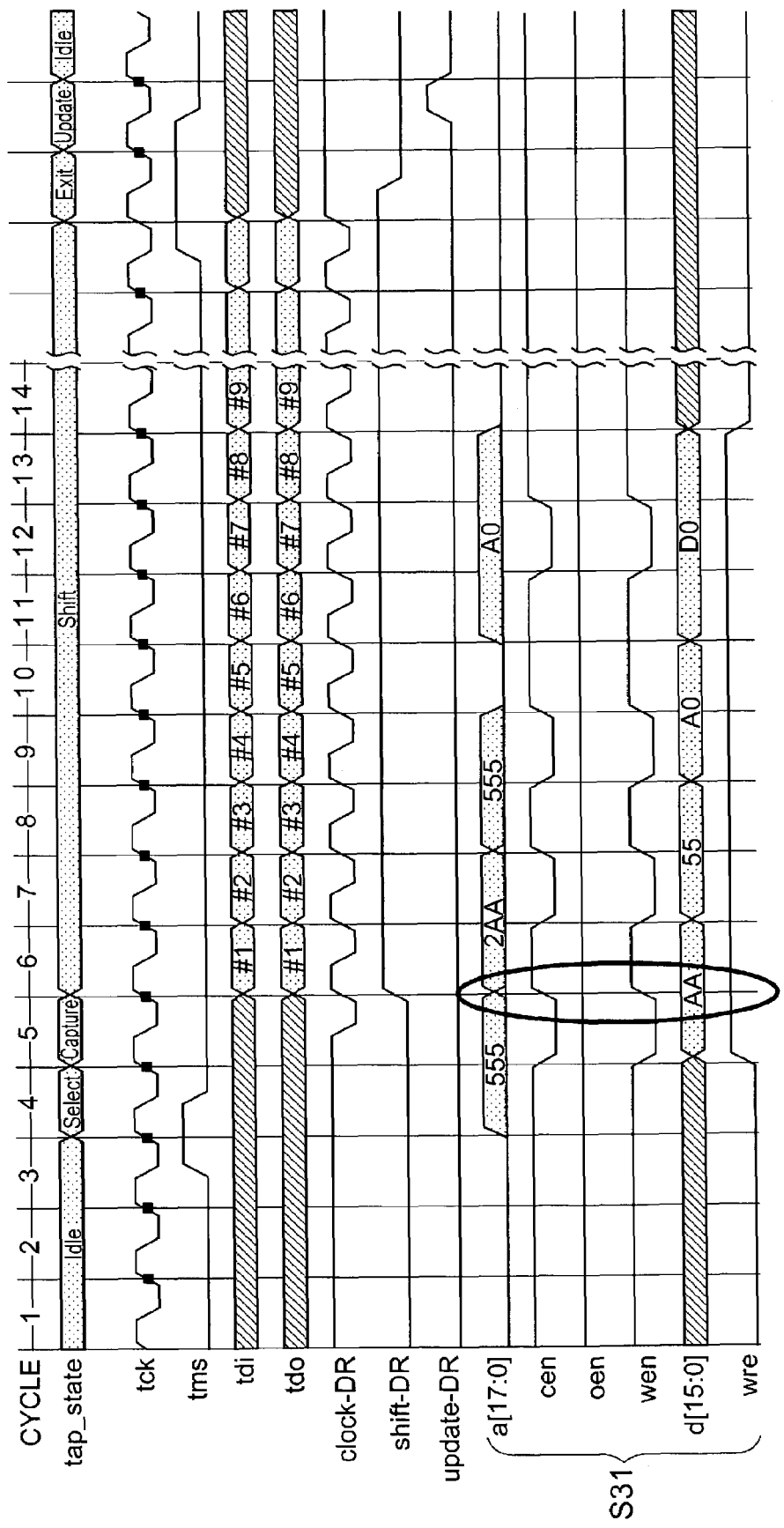
FIG. 6 is a timing chart of FIG. 1.

A timing chart of FIG. 1 for executing such an operation is shown in FIG. 6. In FIG. 6, a serial interface based on the JTAG Standard is used.

Referring to FIG. 6, the BIST circuit is test-started in a first cycle so that the generation of a flash ROM interface signal S31 (address a, chip select signal cen, output enable signal oen, write enable signal wen, data d, and write/read enable signal wre) is started. In the present example, the BIST circuit 10 is test-started and thereafter automatically generates a flash ROM interface signal S31 used for a one-word data program till a 14th cycle. The scan chain 40 takes in or captures the flash ROM interface signal S31 when a TAP state tap-state is of a capture (Capture) state (corresponding to a 5th cycle), and outputs it serially (in the form of one bit in one cycle) in the following shift (Shift) state.

While the signal S31 is captured according to the signal corresponding to the 5th cycle in FIG. 6, the timing provided to capture it is controlled during a retention period of an idle (Idle) state. When it is desired to capture a signal S31 corresponding to an 8th cycle, the idle state is held till a 6th cycle, a select (Select-DR) state is maintained at a 7th cycle, and a Capture state is kept at the 8th cycle, respectively.

Incidentally, while the signal for the flash ROM 50 is captured in the Capture state in FIG. 6, at least two state transitions are needed from an Update-DR state (BIST start) to the Capture state (signal capture) as is understood from the state transition diagram of FIG. 2. Therefore, a start signal is inputted from the BIST start register 40-z of the scan chain 40 to the command generator 31 through the OR gate 47 by way of the two FFs 45 and 46.

(2) A functional test of the data comparator 32 will next be performed.

When the functional test of the data comparator 32 is executed, the command control register 24a (generated commands: read and test data in this case) is set by a method similar to one used upon the normal flash ROM test. Thereafter, an instruction code 1000 (comparison mode for flash ROM output data) is set to the instruction register 12. Next, a signal corresponding to read data of the flash ROM 50 is serially inputted from the serial data input terminal TDI to the scan chain 40 while the TAP state tap-state is held in a Shift state, and data of "1" is serially inputted to the start register 40-z. By setting the TAP state to an update (Update-DR) state, a BIST start signal is supplied from the BIST start register 40-z to the command generator 31 through the FFs 45 and 46 and the gate 47. Further the data serially inputted to the scan chain 40 is inputted to the data comparator 32 as read data (S40-2) for the flash ROM 50.

When a read operation is executed in this state, an expected value generated by the command generator 31 and the rad data (S40-2) of the flash ROM 50 are compared by the data comparator 32. The result of comparison ["0" when it is found to be satisfactory (OK) or "1" when it is found to be unsatisfactory (NG)] is inputted to the selector 33. When an instruction code 1001 (comparison mode for flash ROM output data) is set to the instruction register 12, the selector 33 outputs the signal sent from the data comparator 32 to the terminal TDO as serial data. By doing so, the functional test of the data comparator 32 can be performed by a tester or the like.

(B) Effects (i) and (ii) of (A)

The above-described operational example brings about the following effects.

(i) An actual functional operation test of the BIST circuit 10 per se can be executed at an actual use speed using exactly the same LSI pins as those employed upon the normal flash ROM test without any increase in test pin.

(ii) An actual operation test of the BIST circuit 10 itself can be executed under exactly the same conditions and state as in an actual test state. Even when a failure occurs in the flash ROM test using the BIST circuit 10, it becomes easy to make separation of a failure in the BIST circuit 10 or a failure in the flash ROM 50.

(Example of the Operation of Directly Accessing Flash ROM 50)

Figure 7:
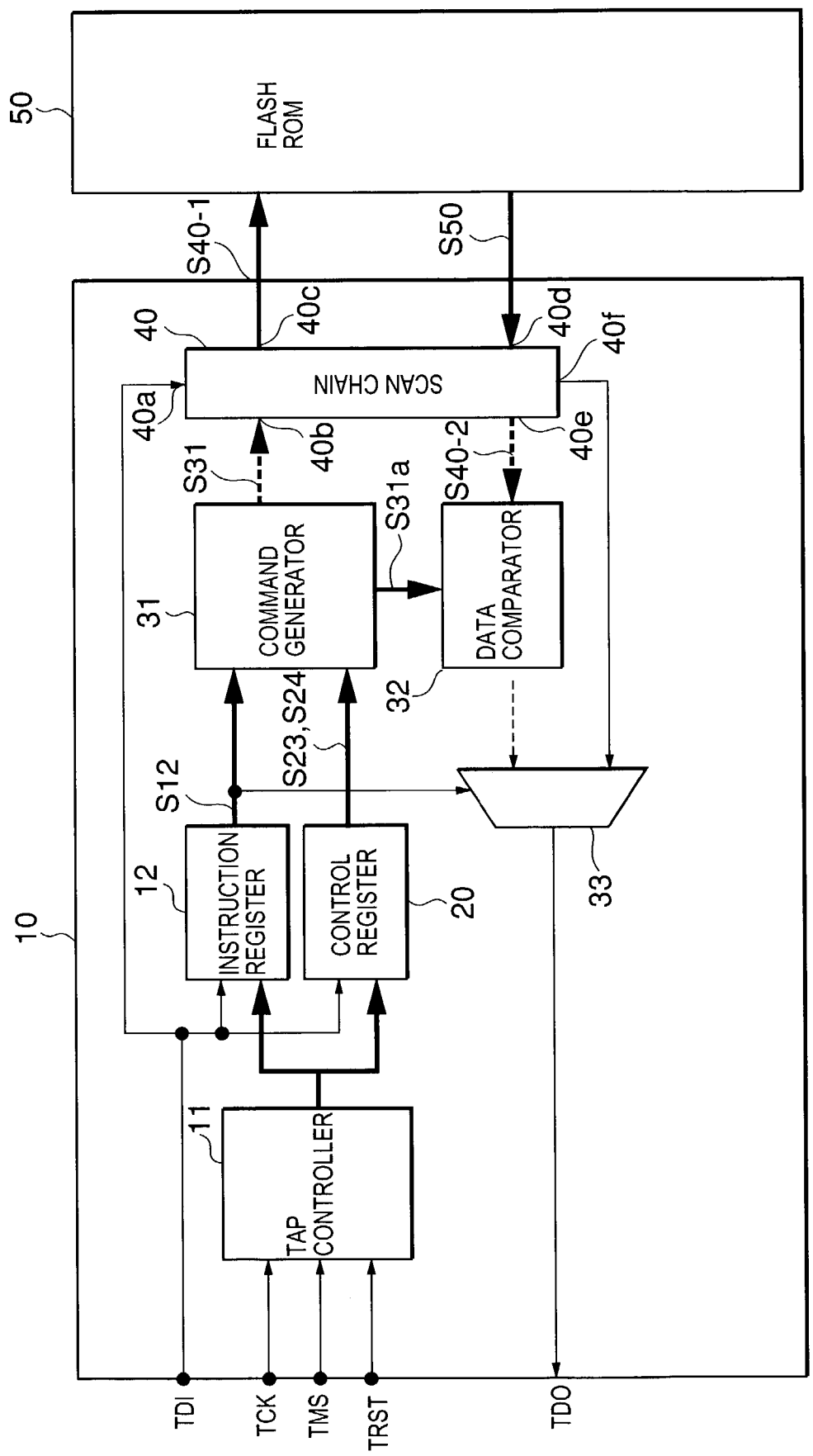
FIG. 7 is a diagram showing an example of the operation of directly accessing the flash ROM shown in FIG. 1.

FIG. 7 is a diagram showing an example of the operation of directly accessing a flash ROM 50 by using the BIST circuit 10 shown in FIG. 10.

An example of the operation of directly accessing the flash ROM 50 without using the command generator 31 of the BIST circuit 10 will be explained with reference to FIG. 7.

(A) Contents of Operation

An instruction code 1000 (direct access mode) is first set to the instruction register 12. Thereafter, a flash ROM interface signal S40-1 is inputted to the serial data input terminal TDI to input a command to the flash ROM 50. The input flash ROM interface signal S40-1 is directly serially inputted to the scan chain 40. When a TAP state is brought to an Update state, data serially inputted to the scan chain 40 is inputted to the flash ROM 50 as the flash ROM interface signal S40-1. Owing to such an operation, arbitrary data can be inputted to the flash ROM 50.

When read data (S50) of the flash ROM 50 is monitored by a tester or the like, a read command is directly inputted from the terminal TDI to the flash ROM 50 in a manner similar to the above operation. Since the instruction code 1000 (direct access mode) has been set to the instruction register 12, the selector 33 is switched to the scan chain 40 according to the instruction code S12.

Thus, the TAP state is brought to a Capture state to take the read data S50 of the flash ROM 50 in the scan chain 40. When the TAP state is brought to a Shift state, the data captured by the scan chain 40 is outputted to the terminal TDO through the selector 33 as serial data. This can be monitored by the tester or the like.

(B) Effects of (A)

The present example of operation brings about the following effects.

A test on the operation of the flash ROM 50 can be performed through the five test pins (terminals TDI, TCK, TMS, TRST and TDO) without any increase in test pin. Therefore, arbitrary test patterns can be supplied to the flash ROM 50 even in the case of, for example, a small pin package wherein the number of signal terminals of the flash ROM 50 is less than 40.

[Use Forms]

The present invention is not limited to the above-described embodiment, and various modifications and use forms can be made thereto. As the modifications and use forms, may be mentioned, ones like the following (1) and (2), for example.

(1) While a description has been made of the test on the flash ROM 50 used as the tested circuit, the present invention can be applied to various devices such as other semiconductor memory devices other than the flash ROM.

(2) While a description has been made of the example in which the test patterns under the serial access based on the JTAG Standard are input and outputted, the test pattern applying method is not limited to the JTAG Standard, and various methods can be adopted.

According to the present invention as described above in detail, transmission path switching means (scan chain) and a selector or the like are provided to perform switching to an internal test result of a semiconductor test circuit or an internal test result of a tested circuit to thereby enable the output thereof. Therefore, for example, an actual functional operation test of the semiconductor test circuit per se can be executed at an actual use speed using exactly the same input terminal, control terminal and output terminal as those employed upon normal testing on the tested circuit without any increase in the number of terminals. Besides, an actual operation test of the semiconductor test circuit per se can be executed under exactly the same conditions and state as in an actual test state, for example. Even when a failure occurs upon testing of the tested circuit using the semiconductor test circuit, it becomes easy to make separation of a failure in the semiconductor test circuit or a failure in the tested circuit.

Further, since direct access from the input terminal or the like to the tested circuit is enabled, a test on the operation of the tested circuit can be performed through the input terminal, control terminal and output terminal without any increase in the number of the input, control and output terminals. Therefore, arbitrary test patterns can be supplied to the tested circuit even in the case of, for example, a small pin package wherein the number of signal terminals, of the tested circuit is less than several tens of signal terminals.

According to the invention, test data and a test control signal can be serially inputted to the input terminal and the control terminal, and a test result can be serially outputted from the output terminal, thus providing general versatility and good usability.

What is claimed is:

1. A semiconductor test circuit comprising:
   an input terminal for inputting test data;
   a control terminal for inputting a test control signal;
   a control circuit for generating a plurality of transition states and outputting an internal control signal when the test control signal is supplied from the control terminal;
   a setting circuit for setting a testing instruction code and control data based on the internal control signal and the test data;
   a command generating circuit for generating a command for testing a test circuit, based on the instruction code and control data received from the setting circuit;
   a transmission path switching circuit having a first port for inputting the test data supplied from the input terminal, a second port for inputting the command supplied from the command generating circuit, a third port for outputting the input data sent from the first or second port to the test circuit, a fourth port for inputting a test result supplied from the test circuit, a fifth port for outputting the input data sent from the first, second or fourth port, and a sixth port for outputting the input data sent from the first, second or fourth port, the transmission path switching circuit switching data transmission paths among the first, second, third, fourth, fifth and sixth ports, based on the internal control signal and the instruction code;
   a comparing circuit for performing a comparison between an expected value supplied from the command generating circuit and the output data sent from the fifth port;
   a selector for selecting either the result of comparison by the comparing circuit or the output data sent from the sixth port, based on the instruction code; and
   an output terminal for outputting the result of selection by the selector.

2. A semiconductor test circuit according to claim 1, wherein the test circuit is a semiconductor memory circuit.

3. A semiconductor test circuit according to claim 1, wherein the transmission path switching circuit is a scan chain including a plurality of boundary scan registers connected in serial.

4. A semiconductor test circuit according to claim 3, wherein the scan chain has a plurality of states changed in response to the internal control signal.

5. A semiconductor test circuit according to claim 3, wherein each of the boundary scan registers includes a multiplexer and a flip flop.

6. A semiconductor test circuit according to claim 1, wherein the setting circuit includes an instruction register for storing the command code and a control register for storing the control data.

7. A semiconductor test circuit: according to claim 1, wherein the control circuit is a test access port controller.

8. A semiconductor test: circuit: according to claim 1, wherein the test circuit includes five test terminals for a standard serial interface based on a JTAG (IEEE 1149.1) Standard.

* * * * *